US006986636B2

(12) United States Patent
Konig et al.

(10) Patent No.: US 6,986,636 B2
(45) Date of Patent: Jan. 17, 2006

(54) DEVICE FOR POSITIONING DISK-SHAPED OBJECTS

(75) Inventors: Joachim Konig, Hanichen (DE); Steffen Kruger, Triebischtal (DE); Bjorn Zimmer, Dresden (DE); Manfred Heinze, Dresden (DE)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 10/297,485

(22) PCT Filed: May 10, 2001

(86) PCT No.: PCT/US01/15193

§ 371 (c)(1),
(2), (4) Date: Apr. 16, 2003

(87) PCT Pub. No.: WO01/96836

PCT Pub. Date: Dec. 20, 2001

(65) Prior Publication Data

US 2003/0206794 A1 Nov. 6, 2003

(51) Int. Cl.
*G06F 7/00* (2006.01)
(52) U.S. Cl. ................ 414/936; 414/754; 414/758; 414/763; 901/31
(58) Field of Classification Search ............... 414/754, 414/936, 935, 941, 806, 816, 758, 763; 700/213, 700/218; 356/244, 426; 901/31, 33, 34
See application file for complete search history.

(56) References Cited

U.S. PATENT DOCUMENTS

| 4,639,028 A | * | 1/1987 | Olson ........................ 294/34 |
| 5,096,291 A | | 3/1992 | Scott ........................ 356/237 |

(Continued)

*Primary Examiner*—Khoi H. Tran
(74) *Attorney, Agent, or Firm*—Perman & Green, LLP; Richard Pickreign

(57) ABSTRACT

A device for positioning disk-shaped objects (1) to inspect the front and rear sides of disk-shaped objects and to reduce the negative effect of large-area contact between the holder and the disk-shaped object. The device comprises a rotatable table (24) which can be adjusted in the x-y direction in an adjustment plane and is intended to accomodate a platform (3). A fork-shaped frame (8) is mounted on the platform so as to be rotatable about an axis of rotation which is aligned perpendicular to the surface of the platform (3) and the angle of tilt of which can be set relative to the adjustment plane. At its fork ends, the fork-shaped frame (8) has another axis of rotation which is aligned perpendicular to the axis of rotation of the fork-shaped frame (8) and about which a frame-shaped object holder (9) is mounted so as to be rotatable in the fork-shaped frame (8) for the purpose of turning the object. The frame-shaped object holder (9), which carries the object in the edge region of the latter, surrounds a center through which passes a pivoting axis aligned parallel to the adjustment plane and intended for setting the angle of tilt of the second axis of rotation relative to the adjustment plane. Devices of this kind can be used to position flat objects in space for purposes of inspecting semiconductor wafers or flat panels.

65 Claims, 8 Drawing Sheets

U.S. PATENT DOCUMENTS

| | | | |
|---|---|---|---|
| 5,851,041 A * | 12/1998 | Anderson et al. | 294/106 |
| 5,880,828 A | 3/1999 | Nakamura et al. | 356/237.3 |
| 5,955,858 A * | 9/1999 | Kroeker et al. | 318/568.11 |
| 5,973,776 A | 10/1999 | Matsushita | 356/237.4 |
| 6,116,848 A * | 9/2000 | Thomas et al. | 414/754 |
| 6,204,917 B1 | 3/2001 | Smedt | 356/237.5 |
| 6,283,701 B1 * | 9/2001 | Sundar et al. | 414/744.5 |
| 6,453,214 B1 * | 9/2002 | Bacchi et al. | 700/245 |
| 6,468,022 B1 * | 10/2002 | Whitcomb | 414/757 |
| 6,606,154 B1 * | 8/2003 | Oda | 356/244 |
| 6,692,219 B2 * | 2/2004 | Coomer et al. | 414/754 |
| 6,828,772 B1 * | 12/2004 | Hofer et al. | 324/158.1 |

* cited by examiner

DEVICE FOR POSITIONING DISK-SHAPED OBJECTS

This application claims the benefit of the earlier filed International Application No. PCT/US01/15193, International Filing Date, May 10, 2001, which designated the United States of America, and which international application was published under PCT Article 21(2) as WO Publication No. WO 01/96836 A1.

BACKGROUND OF THE INVENTION a) Field of the Invention

The invention relates to a device for achieving different tilt angles of planar objects relative to a reference plane and rotation of the object about an axis aligned perpendicular to the surface of the object. Devices of this kind can be used to position flat objects and, in particular, for purposes of inspecting substrates, such as semiconductor wafers or flat panels.

b) Description of the Related Art

Technical solutions known hitherto operated on the basis of a three-dimensionally adjustable receiving element for the semiconductor wafers to be inspected, said element being provided with a vacuum suction device serving to hold the wafer. The receiving element holds the semiconductor wafer during the inspection process and, by virtue of its construction, allows rotary motion at different angles of tilt relative to the illumination beam path or direction of inspection.

In a known positioning system of this kind as disclosed, for example, in U.S. Pat. No. 5,096,291, use is made of a holder which is mounted in an articulated manner to allow it to perform the movements. Actuating elements in the form of tappets transmit the movements to the holder from a ring, the angle of tilt of which can be adjusted and which is coupled concentrically to a rotatable spindle.

All solutions which operate with the aid of a vacuum suction device have the disadvantage that viewing from the rear is severely limited.

When the semiconductor wafer is held by largely surface-type contact as hitherto, migration can have an unwanted disruptive effect on the intended wafer properties. Moreover, more recent technological requirements mean that the semiconductor wafer must only be brought into contact with holding elements in a narrowly defined edge region. The entire rear area is also unsuitable as a contact area.

The system known from U.S. Pat. No. 5,096,291 also entails a further restriction due to the use of tappets, which allow only a limited range of motion to be achieved by the holder.

OBJECT AND SUMMARY OF THE INVENTION

It is the primary object of the invention to increase productivity in the inspection of the front and rear sides of disk-shaped objects and to reduce the negative effect of large-area contact between the holder and the disk-shaped object on the material properties of the disk-shaped object.

According to the invention, the object is achieved by a device for positioning disk-shaped objects.

The device comprises a table which can be adjusted in the x-y direction in an adjustment plane, can be rotated about a first axis of rotation aligned perpendicular to the adjustment plane and is intended to receive a platform. A fork-shaped frame is mounted on the platform in such a way as to be rotatable about a second axis of rotation, which is aligned perpendicular to its surface and the angle of tilt of which can be set relative to the adjustment plane. At its fork ends, the fork-shaped frame has a third axis of rotation, which is aligned perpendicular to the second axis of rotation and about which a frame-shaped object holder is mounted in such a way as to be rotatable in the fork-shaped holder for the purpose of turning the object. The frame-shaped object holder, which carries the object in the edge region of the latter, surrounds a center through which passes a pivoting axis aligned parallel to the adjustment plane and intended for setting the angle of tilt of the second axis of rotation relative to the adjustment plane.

The table which can be adjusted in the x-y direction in the adjustment plane ensures that object transfer to the frame-shaped object holder can take place in an accurately fitting manner while avoiding any displacement of the object on supporting elements. A positive effect is furthermore exerted on productivity since it is possible to eliminate working steps such as prealignment of the object and devices required for this purpose.

A stable base for rotation of the object is created by means of an arcuate guide in which the platform is mounted for the purpose of setting the angle of tilt relative to the table. A mounting, achievable well below the object, can thereby be separated in a simple manner from the region of the object supported and thereby protected from particles. Since the pivoting axis of the arcuate guide, said axis being aligned parallel to the adjustment plane, passes through the center of the frame-shaped object holder, the tilting of the platform is associated with tilting of the object in the same way.

Rotation about the first axis of rotation can also be performed in a very stable manner a long way below the object and allows simple adaptation of the device to the handling direction of a higher-order system.

The rotary drive for the fork-shaped frame, with the aid of which drive rotation of the object about its mid-perpendicular can be achieved, can also be positioned a long way below the object and in an economical manner. Said mid-perpendicular can be set to all required angles in space by rotation of the fork-shaped frame, tilting of the platform and hence of the object relative to the adjustment plane and rotation of the table superimposed on these movements.

The single drive provided for turning the object through 180° can be enclosed with little outlay. Fundamentally, the object can be turned in all positions and even while the object is being rotated.

The frame-shaped object holder is provided with clamping devices, between which the edge region of the object is clamped when held, the clamping devices comprising rests for the edge region and contact-pressure elements which can be adjusted toward the object to press the edge region of the object against the rests and away from the object to release the clamping devices. It is advantageous if, to allow adjustment of each contact-pressure element, each contact-pressure element is secured on a spring element which is provided on the frame-shaped object holder, is prestressed toward the object to be held and on which a tension element that can be actuated to release the clamping device engages. Particularly suitable as a tension element are clamped-in wires made of a shape memory alloy which shorten in length when heated. It is possible to heat the wires in a simple manner by connecting the wires into an electric circuit. It is also advantageous if, to reduce the areas of contact with the object to be held, the rests and the contact-pressure elements have curved surfaces which, in the clamping condition, engage on chamfered edges of the edge region of the object and if each clamping device is provided with a sensor on the frame-shaped object holder to detect the clamped and unclamped condition of the object. The frame-shaped object holder furthermore comprises an open region for handler access to feed in and remove an object.

The particular advantages of the frame-shaped object holder are that no troublesome illumination shadows or hindrances to viewing in the area of interest arise at the object in the case of an inspection. The object does not make surface contact anywhere but makes only point contact with its oblique edge on the arched rests, which are composed of inert material and do not leave any traces of scratching. Since the clamping devices engage on the object in the regions in which no structuring is provided in the production process, the object can be seen almost completely and from both sides. By means of a sufficiently large number of clamping devices, it is possible to ensure that any notches or flats which may coincidentally be present in the clamping region do not lead to any significant loss of clamping.

The invention is explained more fully with reference to the schematic drawings.

DESCRIPTION OF THE PREFERRED EMBODIMENTS

Figure 1:
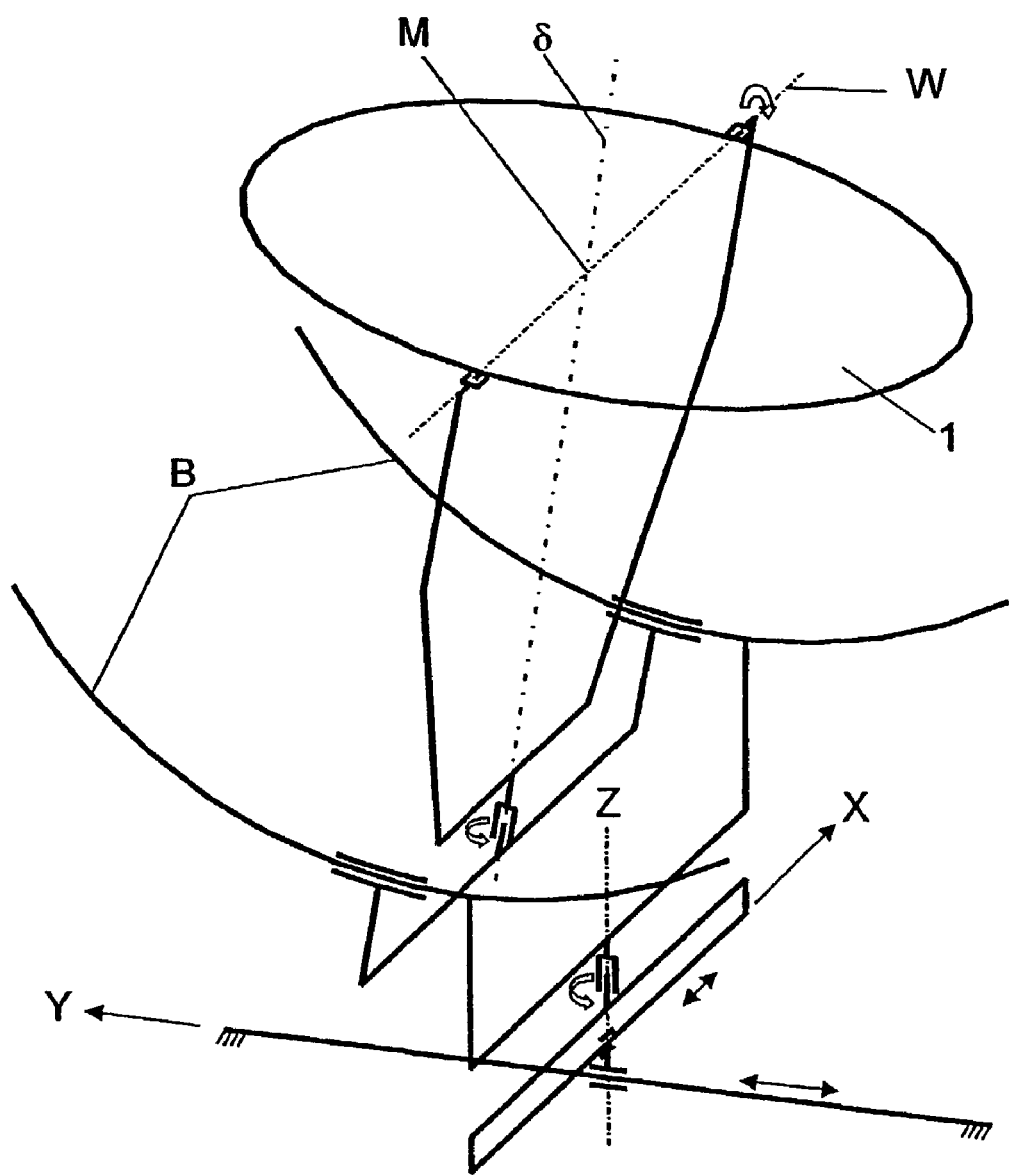
FIG. 1 shows a system of axes of motion used in the positioning device under consideration.

The diagram in FIG. 1 illustrating the axes of motion is intended to clarify how a disk-shaped object 1, e.g. a semiconductor wafer or a flat panel, can be positioned in space with the device under consideration for the purposes of inspection.

For the object 1, which can be turned about a turning axis W for inspection of the front and rear, provision is firstly made for rotation about an axis of rotation 8 passing through the center M of the object 1 and corresponding in the inspection position illustrated to the mid-perpendicular to the object 1. In the case of the semiconductor wafer used in the present example, the turning axis W extends along its diameter. The turning axis 8 can be tilted at different angles of tilt relative to a vertical z axis of a reference system along a circular arc B by means of a pivoting movement. The associated pivoting axis likewise passes through the center M and is aligned parallel to an adjustment plane X-Y, which occupies a horizontal position in the reference system. In the position shown in FIG. 1, the pivoting axis coincides with the turning axis W. With the device under consideration, a rotary motion about the z axis and translatory X-Y movements in the adjustment plane X-Y can furthermore be superimposed on the adjustments about the turning axis W, the axis of rotation 8 and the setting of their tilting relating to the vertical z axis and hence to the adjustment plane X-Y.

The positioning system illustrated thus far by means of an axis model will now be explained in its structural configuration.

Figure 2:
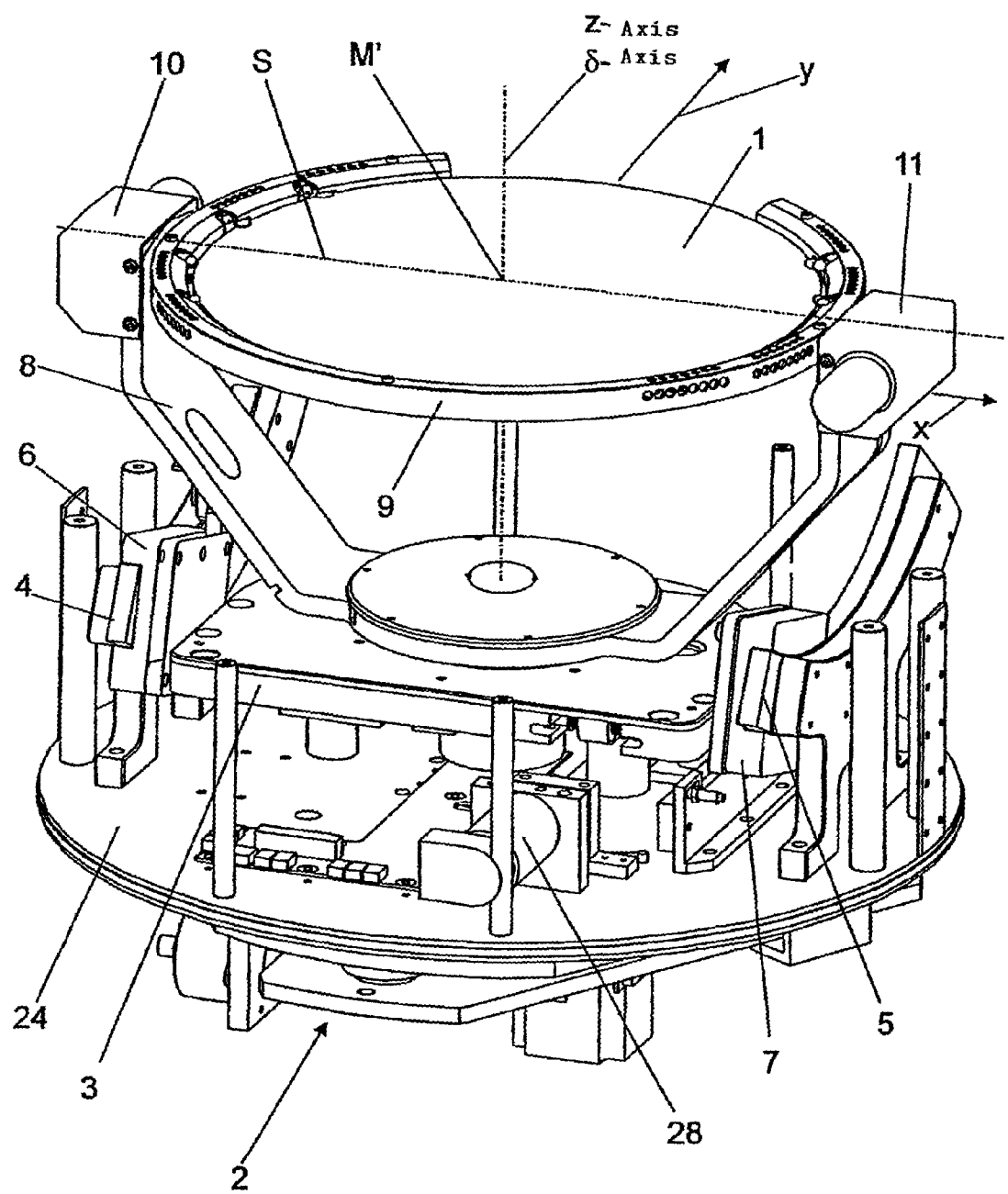
FIG. 2 shows the positioning device with an object which is situated in a horizontal position.

In the positioning device in accordance with FIG. 2, the object 1 in the form of a semiconductor wafer to be positioned is in a position in which both supply and removal of the object 1 can take place. In this horizontal position, in which the object 1 is aligned parallel to the adjustment plane X-Y, the axis of rotation 8 and the vertical z axis of the reference system coincide.

A X-Y-φ table 2, which can be adjusted in the adjustment plane X-Y and rotated about the z axis, carries a platform 3, the angle of tilt of which relative to the adjustment plane X-Y can be set by a pivoting motion about a pivoting axis S by means of an arcuate guide.

For this purpose, guide tracks 4, 5, in which the platform 3 is guided with the aid of slides 6, 7, are secured on the X-Y-φ table 2. A fork-shaped frame 8, which is mounted on the platform 3 in such a way as to be rotatable about an axis aligned perpendicular to the surface of the platform 3 and corresponding to the 8 axis, acts as a carrier for a frame-shaped object holder 9. The frame-shaped object holder 9 surrounds a center M' which coincides, in the case of the object 1 under consideration, with the center M of the latter. At its fork ends, the fork-shaped frame 8 contains bearing and drive elements 10, 11, by means of which the frame-shaped object holder 9 is mounted rotatably about an axis corresponding to the turning axis W. The rotation of the frame-shaped object holder 9 is provided to enable the object 1 to be turned for inspection on both sides. The fork-shaped frame 8 is correspondingly wide. The pivoting axis S aligned parallel to the adjustment plane X-Y passes through the center M', with the result that the object 1 too is tilted relative to the adjustment plane X-Y by the pivoting motion. If the object 1 is a semiconductor wafer, as in the present example, the pivoting axis S coincides with the diameter of the semiconductor wafer.

Figure 3:
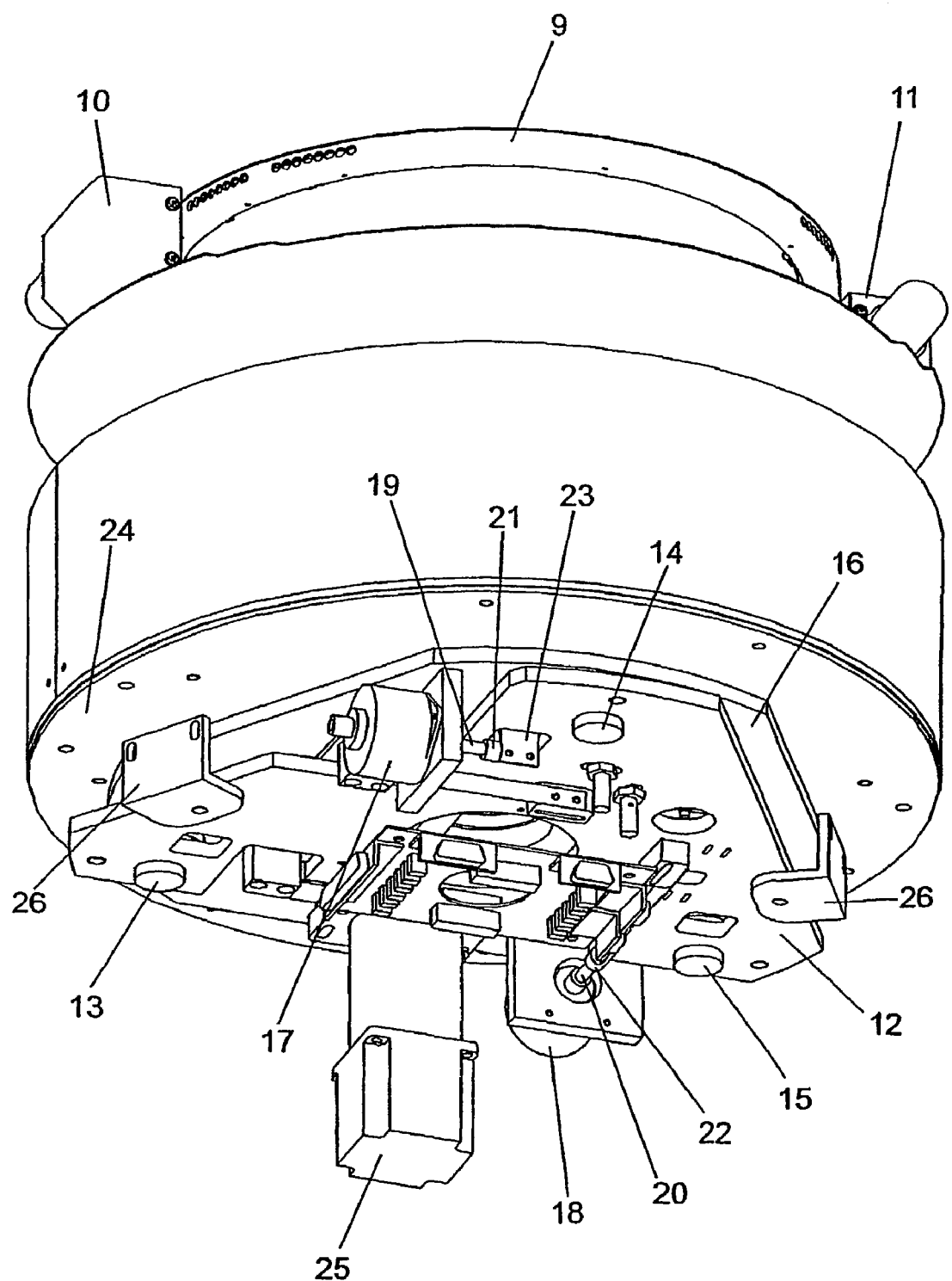
FIG. 3 shows the positioning device in a perspective representation from below.

The view of the positioning device from below in accordance with FIG. 3 shows to a large extent the components of the X-Y-φ table 2 and its drive means. A positioning plate 16, which can be displaced in the x and y directions on roller bearings 13, 14, 15 is provided on a base plate 12 fixed to the stand. Servomotors 17 and 18 for the x direction and the y direction respectively are secured on the positioning plate 16. Power transmission is provided by drive spindles 19, 20, the spindle nuts of which are formed by the rotors of the servomotors 17, 18. The drive spindles 19, 20 are fixed by means of fixing devices 21, 22 and coupled to the base plate 12 with the aid of leaf spring couplings. Of the leaf spring couplings, only that denoted by 23 and located on the drive spindle 19 for adjustment in the x direction can be seen. Finally, a table plate 24 is mounted on the positioning plate 16 in such a way as to be rotatable about the z axis by means of bearings (not shown), the power produced by a drive motor 25 being transmitted to the rotatable table plate 24 by means of a toothed-belt drive (likewise not shown). If one of the servomotors 17, 18 is put into operation, the positioning plate 16 and the respective servomotor 17 or 18 are displaced relative to the base plate 12. The leaf springs of the leaf spring couplings each have a stabilizing effect in a perpendicular direction to the respective direction of displacement.

Since the positioning plate 16 is free to move relative to the base plate 12 apart from the effects of the leaf spring couplings, transport fixings 26 are provided for transportation, by means of which both plates 12, 16 can be connected to one another.

Figure 4:
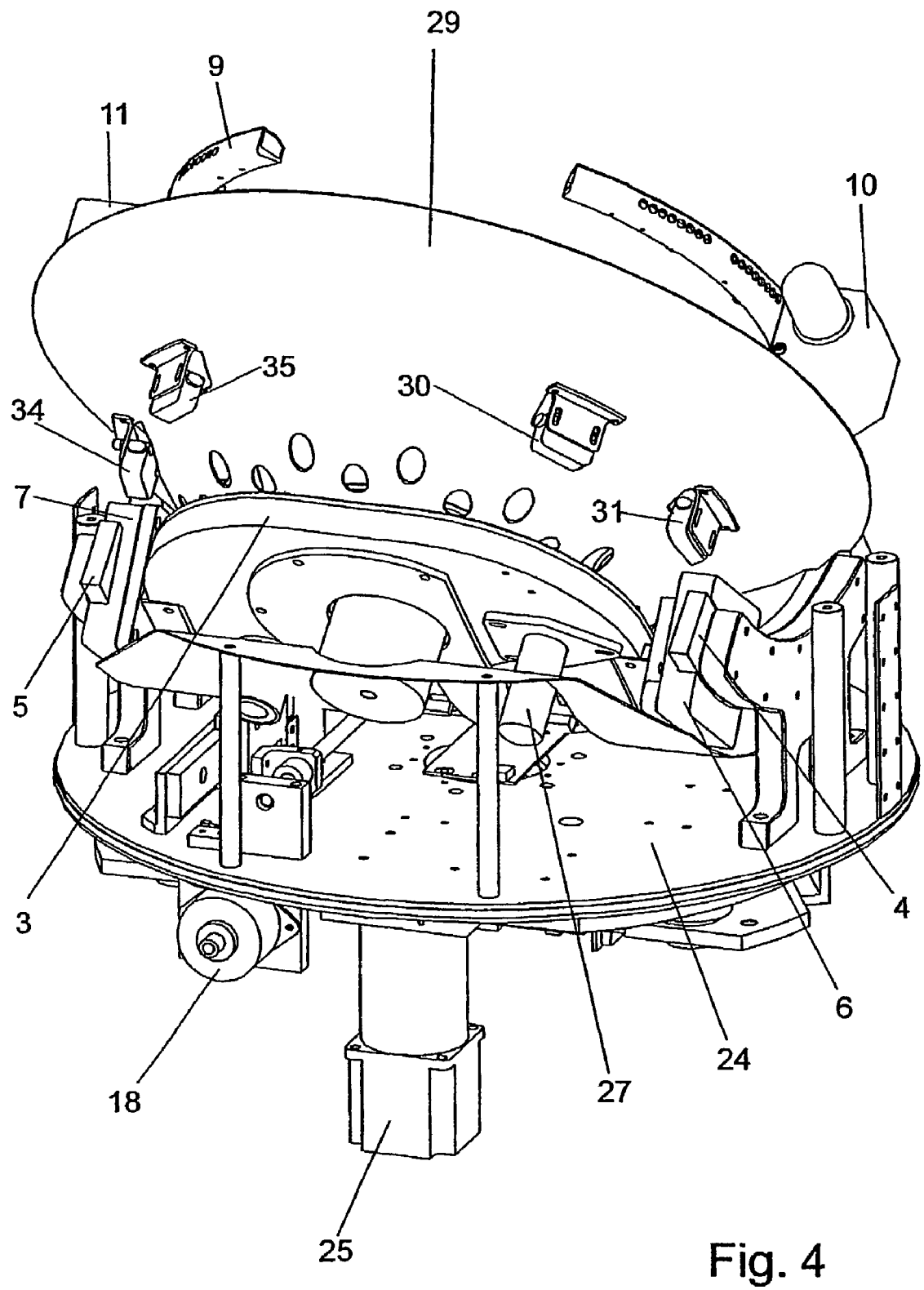
FIG. 4 shows the positioning device in a rear view, in which the object is tilted.

Underneath the platform 3 there is a drive motor 27 (see FIG. 4) for the fork-shaped frame 8 and a drive motor 28 (see FIG. 2, and not shown in FIG. 4 for the sake of clarity) for the arcuate guide. The object 1 is additionally shielded from particles with respect to both motors 27, 28, which, like the associated gear and guide elements, are enclosed, by a bowl-like part 29 (see FIG. 4, and not shown in FIG. 2 for the sake of clarity).

The part 29 furthermore serves as a fixing element for six sensors 30, 31, 32, 33, 34 and 35 for detecting the position of the object 1 as it is fed to the positioning device, in particular as it is transferred to the frame-shaped object holder 9 with the aid of a handling arm (not shown). Corresponding openings in the part 29 allow a clear view of the object 1. Of the sensors, only four, denoted by 30, 31, 34 and 35, can be seen in FIG. 4. The other sensors 32 and 33 can be seen in the basic illustration in FIG. 5, with the aid of which the alignment of the positioning device relative to the object 1 to be fed in will be described in greater detail.

Figure 5:
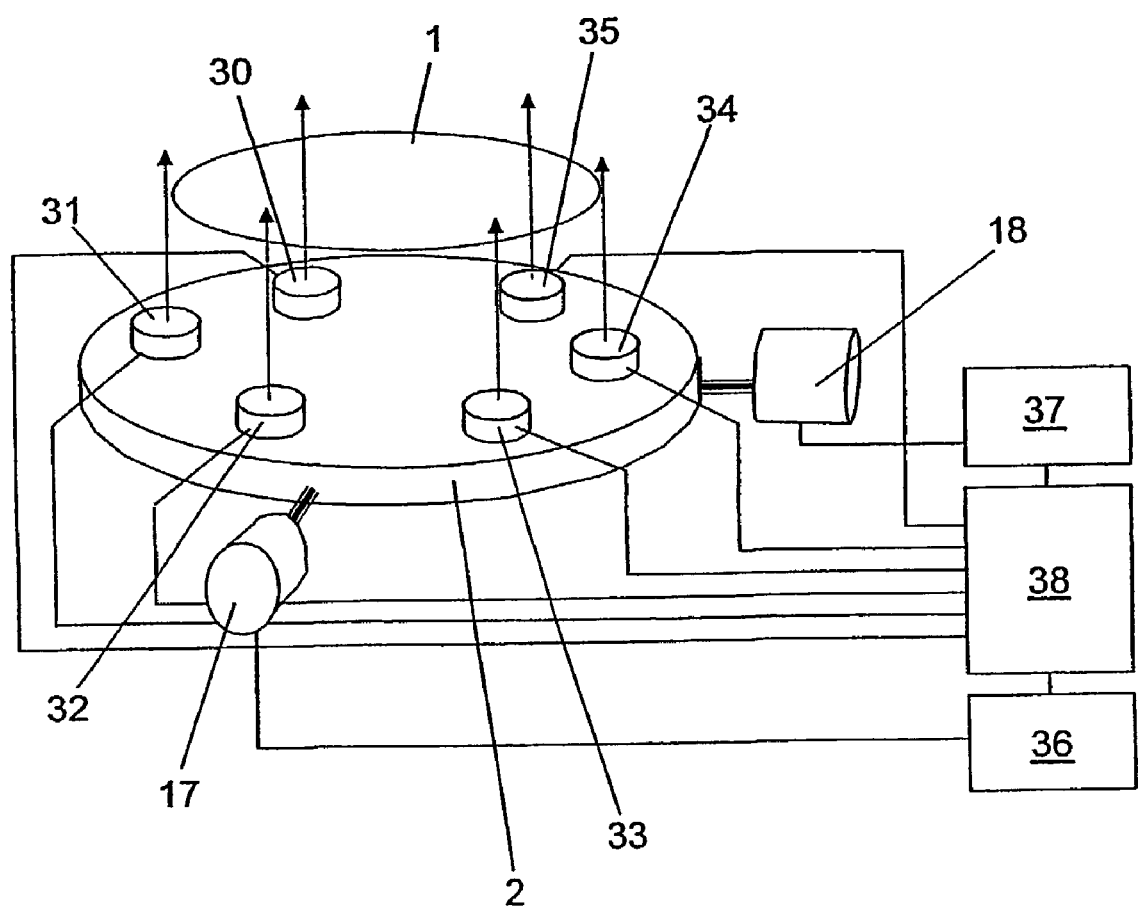
FIG. 5 shows a basic diagram relating to detection of the position of the object.

Referring to FIG. 5, for the alignment process, the servomotors 17 and 18 provided on the X-Y-φ table 2 for the adjustment in the x and y directions are connected to control devices 36, 37, which are connected to outputs of a unit 38 for determining positioning vectors. The inputs of the unit 38 are coupled to the sensors 30, 31, 32, 33, 34 and 35.

Once the object 1 has been positioned above the frame-shaped object holder 9, which is in a horizontal position, the deposition points of the object 1 relative to the required feed position are determined with the aid of the sensors 30, 31, 32, 33, 34 and 35. From these, the unit 38 calculates positioning vectors pointing in the opposite direction to the respective deposition point for the purpose of determining corresponding manipulated variables for the servomotors 17 and 18 in the control devices 36, 37. This results in adjustment of the X-Y-φ table 2 in the adjustment plane X-Y. This process is continued until none of the sensors 30, 31, 32, 33, 34 and 35 can detect the presence of the object 1 in its detection range. The positioning device has been moved into the feed position relative to the object 1.

Figure 6:
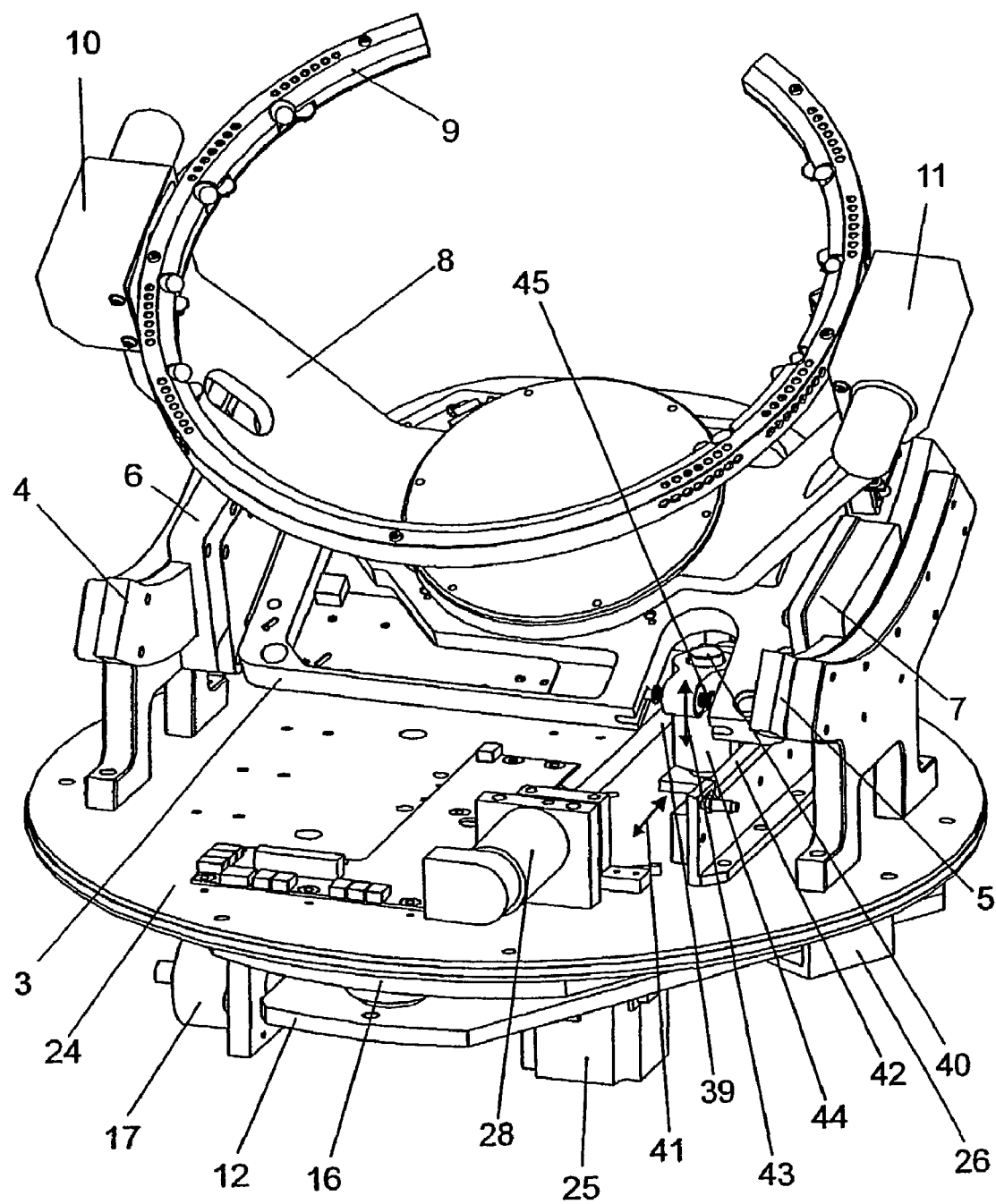
FIG. 6 shows the positioning device in a perspective representation from the front and from above, in which the object is tilted.

To tilt the platform 3 with the aid of the arcuate guide, a tilting drive is provided, as shown in FIG. 6, and, in this tilting drive, the drive motor 28 is connected to a spindle drive 39, which adjusts a stud 40 along a linear guide 42 in the direction indicated by 41. Seated on the stud 40 is a sleeve 44 which can be displaced vertically in the direction of the arrow 43 and engages on the platform 3 by means of a rotatably mounted driver element 45. If the stud 40 is moved in direction 41, the platform 3 is pivoted on the arcuate guide. Since the platform 3 assumes different vertical positions during the pivoting motion owing to its connection to the arcuate guide, height compensation is required during power transmission at the linear drive. This is the purpose of the sleeve 44 displaceable on the stud 40 and of the rotatable mounting of the driver element 45.

Figure 7:
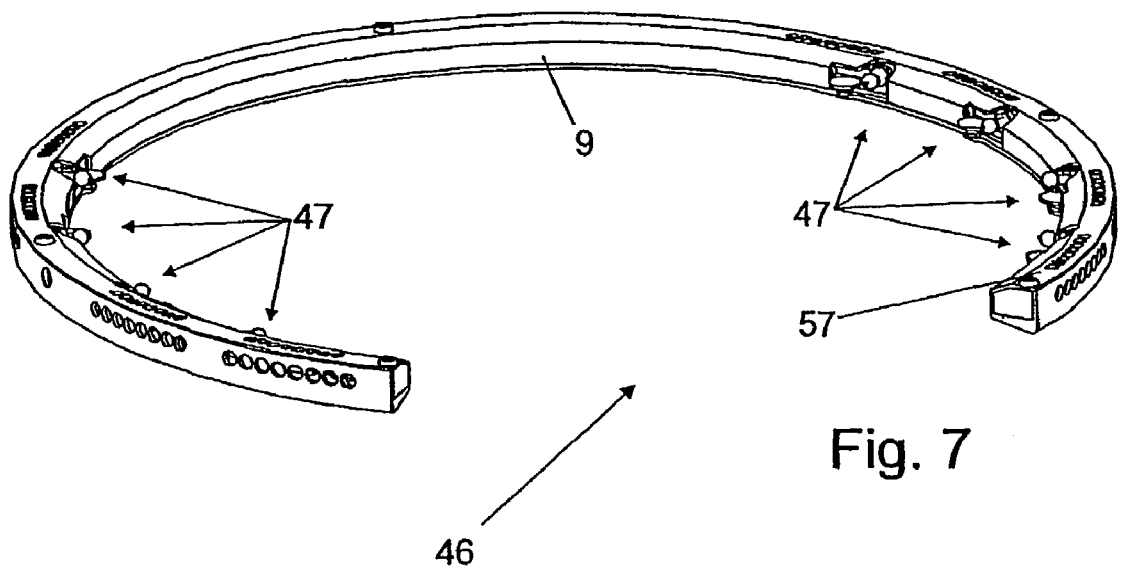
FIG. 7 shows an encased frame-shaped object holder.
Figure 8:
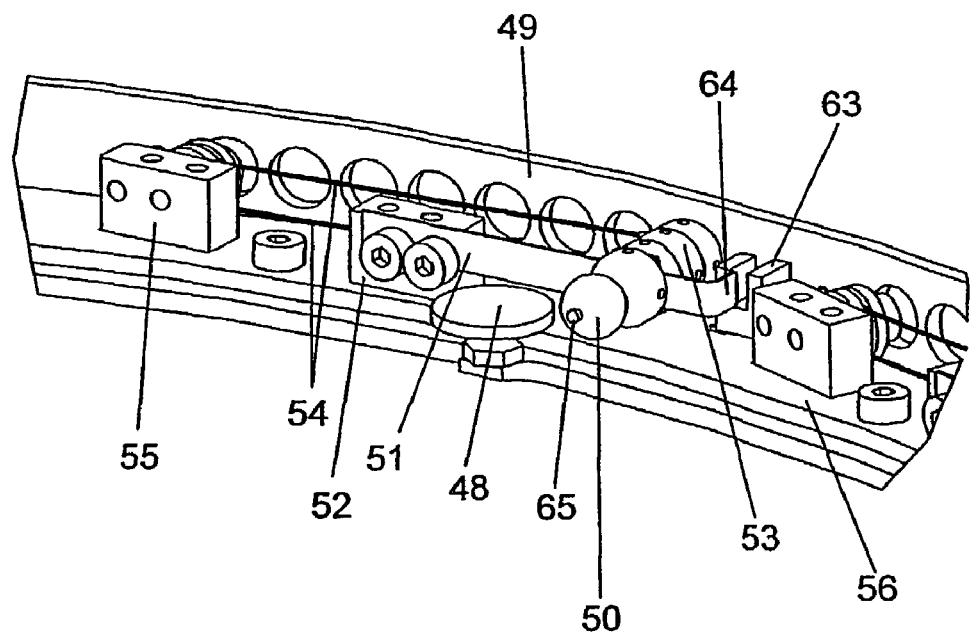
FIG. 8 shows a detail of the opened object holder.

For the particular case under consideration of the holding of a semiconductor wafer, the frame-shaped object holder 9 illustrated in detail in FIGS. 7 and 8 is of annular design and contains an open region 46 for handler access to feed in and remove the object 1. Eight clamping devices 47 are distributed along the circular ring in such a way that they lie opposite one another in four pairs. The number of individual holders ensures reliable holding of the object 1, even if one of the clamping devices 47 remains inoperative because of the particular shape of the object 1. To hold the object 1, vertically adjustable rests 48 lying in a common deposition plane are attached to an angled supporting body 49 in such a way that they project into the space enclosed by the circular ring. The rests 48 are composed of inert material and have an arched surface, with the result that there is only point contact with the edge region of an object 1 resting on them. The object holder 9 should hold the objects 1 only in an edge region which is not intended for the formation of structured areas in the production process. It is advantageous if the object 1 rests on one of two mutually opposite chamfers in the edge region. The other chamfer is provided for contact with ball-shaped contact-pressure elements 50, likewise composed of inert material; ceramics or sapphire. The contact-pressure elements 50 immobilize the object 1, with an area below their diameter pressing the object 1 against the point rests 48. The necessary contact-pressure force is produced by leaf springs 51 which are secured at one end on first holding pedestals 52 and are preloaded in the direction of the object 1 to be immobilized by the clamping between the rests 48 and the contact-pressure elements 50. The contact-pressure elements 50 are secured on the other, freely movable end of the leaf spring 51. The counter force required to cancel immobilization is produced with the aid of tension elements which engage on the leaf springs 51 via levers 53 pointing away from the object 1 to be clamped. The tension elements are designed as wires 54 composed of a shape memory alloy. For reasons of security, the wires 54 are present as a double pair, with the result that a defect in a single wire does not lead to failure of a clamping device 47. One end of each of the wires 54 is clamped to the lever 53, and the other end is clamped to second holding pedestals 55. The holding pedestals 52 and 55 are secured on a printed circuit board 56 and, like the leaf spring 51 and the wires 54, are manufactured from conductive material. For reasons of cleanliness, the angled supporting body 49 is closed off at the top together with the printed circuit board 56 mounted on it by a sectional closure ring 57 which, to partition off the object 1 from the printed circuit board 56, has openings only for the rests 48 and the contact-pressure elements 50.

The tensile force is made to act in the wires 54 by heating resulting from a supply of electric current, whereupon the wires 54 shorten, with the result that the leaf springs 51 are pulled back away from the object 1 together with the contact-pressure elements 50. This actuation does not require any supports and is therefore completely free from the production of particles in the vicinity of the object 1.

Figure 9:
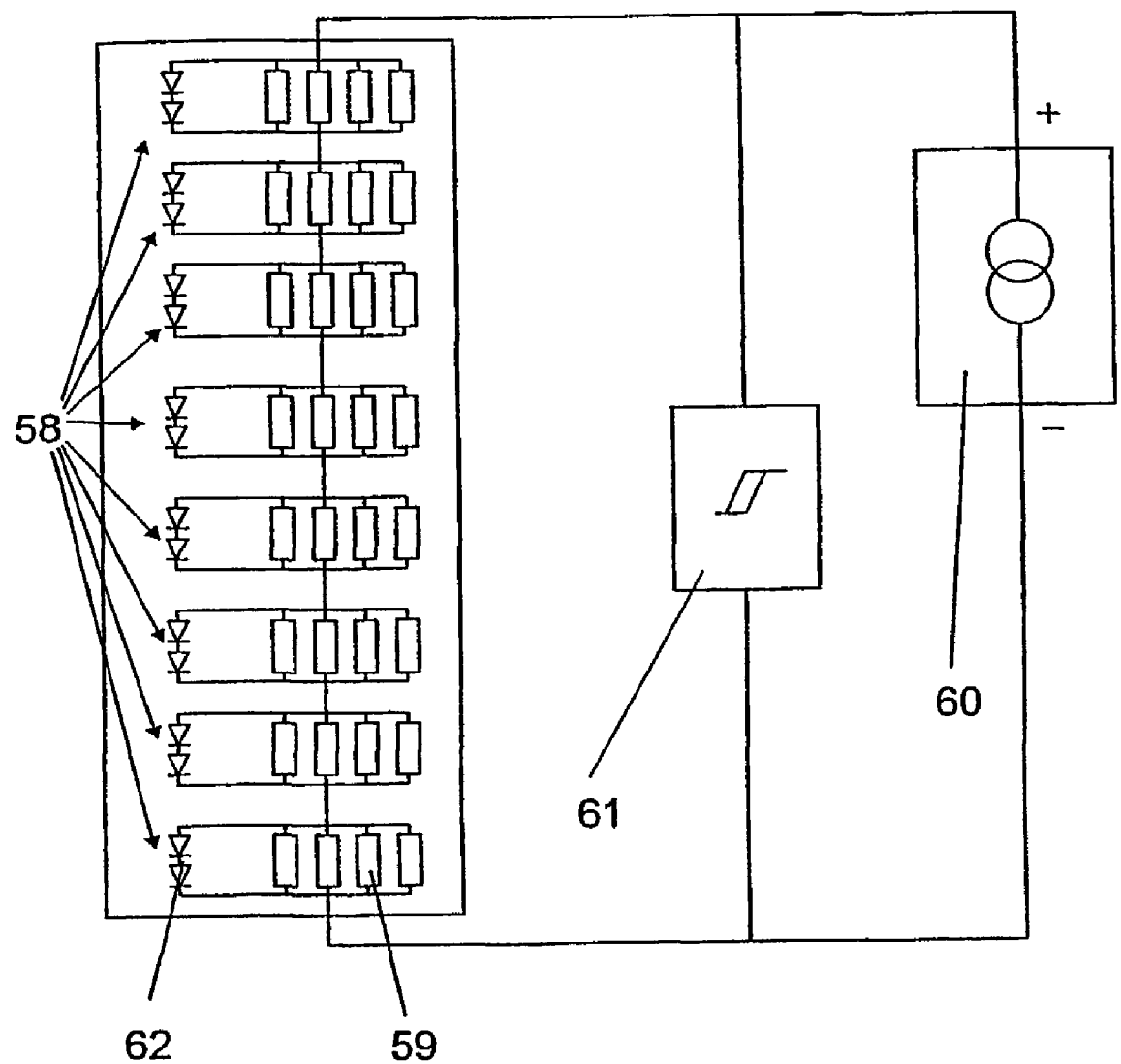
FIG. 9 shows a circuit diagram for the purpose of explaining the operation of the object holder.

FIG. 9 illustrates, in a diagram, the action of the eight clamping devices 47. Circuit components 58 connected in series represent the clamping devices 47, each of the four resistors 59 which it contains corresponding to one of the wires 54. The overall unit made up of the circuit components 58 is fed with a constant current by a power source 60. A voltage meter 61 is used to measure a total increased voltage drop, which occurs in the event of a malfunction. This can occur if a defect occurs in one of the wires 54. If, beyond this tolerable case of a defect in a single wire, both pairs of wires are interrupted, a diode shunt 62 assumes the conducting function, with the result that total failure of all the clamping devices 47 is prevented and the current operation of releasing clamping is assured.

As seen in FIG. 8, sensors 63 in conjunction with angled leaf spring end pieces 64 on the freely movable ends of the leaf springs 51 are used to distinguish between the states of clamping and release of the object 1, in which the clamping devices 47 may be. Owing to the different deflections of the leaf spring end pieces 64 in the two states, the sensors 63 are unactuated in the state of clamping while, in the state of release, the leaf spring end pieces 64 project into the detection zones of the sensors 63 to form a signal. The ball-shaped contact-pressure elements 50 are additionally provided with a securing element, in the present example in the form of a cylindrical pin 65 which projects from the contact-pressure element 50 in the direction of the object 1 and, in normal operation does not touch the object 1. The cylindrical pin 65 prevents the object 1 from pushing the leaf spring 51 out beyond the ball wedge formed to such an extent that the object can fall out when there is a non-nominal impact effect during inspection of the rear side. The leaf springs 51 are dimensioned in such a way that normal upside down operation is no problem.

While the foregoing description and drawings represent the present invention, it will be obvious to those skilled in the art that various changes may be made therein without departing from the true spirit and scope of the present invention.

What is claimed is:

1. A device for positioning substantially planar objects comprising:
    a table which can be adjusted in the x-y direction in an adjustment plane, can be rotated about a first axis of rotation aligned perpendicular to said adjustment plane and is intended to receive a platform;
    said platform having a surface and a second axis of rotation, which is aligned perpendicular to said surface and an angle of tilt of which can be set relative to said adjustment plane;
    a fork-shaped frame which is mounted on said platform in such a way as to be rotatable about said second axis of rotation;
    a frame-shaped object holder for an object for carrying said object in an edge region of the object and surrounds a center through which passes a pivoting axis aligned parallel to said adjustment plane and intended for setting said angle of tilt of said second axis of rotation relative to said adjustment plane;
    said fork-shaped frame having fork ends with a third axis of rotation, which is aligned perpendicular to said second axis of rotation and about which said frame-shaped object holder is mounted in such a way as to be rotatable in said fork-shaped frame for the purpose of turning said object.

2. The device according to claim 1, wherein, for the purpose of setting the angle of tilt relative to said adjustment plane, said platform is mounted in an arcuate guide, the pivoting axis of which is aligned parallel to said adjustment plane and passes through said center of said frame-shaped object holder, the tilting of said platform thereby being associated with tilting of said object in the same way.

3. The device according to claim 2, wherein said frame-shaped object holder is provided with clamping devices, between which said edge region of said object is damped when held.

4. The device according to claim 3, wherein said clamping devices comprising rests for said edge region and contact-pressure elements which can be adjusted toward said object to press said edge region of said object against said rests and away from said object to release said clamping devices.

5. The device according to claim 4, wherein, to allow adjustment of each contact-pressure element, each contact-pressure element is secured on a spring element which is provided on said frame-shaped object holder, is prestressed toward said object to be held and on which a tension element that can be actuated to release said clamping device engages.

6. The device according to claim 5, wherein said tension element is formed by clamped-in wires made of a shape memory alloy which shorten in length when heated.

7. The device according to claim 6, wherein said wires are connected into a circuit to allow heating.

8. The device according to claim 7, wherein, to reduce the areas of contact with said object to be held, said rests and said contact-pressure elements have curved surfaces which, in the clamping condition, engage on chamfered edges of said edge region of said object.

9. The device according to claim 8, wherein said frame-shaped object holder comprises an open region for handler access to feed in and remove an object.

10. The device according to claim 9, wherein each clamping device is provided with a sensor on said frame-shaped object holder to detect the clamped and unclamped condition of said object.

11. A semiconductor object positioning device for holding and moving a substantially planar semiconductor object that has opposite planar sides defining a thickness of the object therebetween, the device comprising:
    an object holder comprising a center through-hole which is sized and shaped for receiving the object such that opposite planar sides of the object are substantially entirely visible at opposite sides of the object holder, the object holder further comprising a clamping element operable to exert a compressive force across the thickness of the object; and
    a movement mechanism for moving the object holder, the movement mechanism comprises a drive connected to the object holder for flipping orientation of the object holder and the object held by the object holder about 180°.

12. A device as in claim 11 wherein the object holder comprises a general ring shape with one open section through the ring shape.

13. A device as in claim 11 wherein the object holder comprises rests which extend into the through-hole and contact elements movable into and out of the through-hole to clamp portions of the object at an outer perimeter of the object between the rests and contact elements, wherein the contact elements are independently movable relative to the rests.

14. A device as in claim 11 wherein the movement mechanism comprises a fork-shaped frame member having the object holder rotatably connected to ends of opposite arms of the fork-shaped frame member.

15. A semiconductor object positioning device for holding and moving a substantially planar semiconductor object, the device comprising:
    an object holder comprising a frame with a receiving area which is sized and shaped for receiving the object;
    a movement mechanism connected to the object holder for moving the object holder; and
    sensors connected to the movement mechanism at a first side of the object holder and having sensor paths through the receiving area for sensing an outer perimeter of an object being held on an opposite second side of the object holder and awaiting positioning into the receiving area,
    wherein the movement mechanism moves the object holder, based upon input from the sensors, to a predetermined position relative to the object for receiving the object at a predetermined position in the receiving area.

16. A device as in claim 15 wherein the sensors are optical sensors connected to a bottom side of a bowl shaped member located beneath the object holder, the sensor paths extending through holes in the bowl shaped member.

17. A semiconductor object positioning device for holding and moving a substantially planar semiconductor object, the device comprising:
a general ring shaped object holder;
a fork-shaped frame member connected to the object holder for flipping orientation of the object holder; and
an arcuate guide for tilting the fork-shaped frame member relative to a support table, the arcuate guide comprising arcuate shaped guide tracks connected to the support table and slides connected to the fork-shaped frame member, the slides having recesses with the guide tracks slidably located in the recesses.

18. A device as in claim 17 wherein the object holder comprises a general ring shaped frame with an opening gap through a side section of the general ring shape.

19. A device as in claim 17 further comprising a motor for rotating the fork-shaped frame member.

20. A semiconductor object holder for holding a substantially planar semiconductor object, the holder comprising:
a frame having a receiving area for receiving the object; and
contact elements movably connected to the frame between an inward position into the receiving area and an outward position out of the receiving area,
wherein, when the contact elements are located in their inward positions, the contact elements are adapted to clamp portions of the object between bottom surfaces of the contact elements and top surfaces of rests on the frame in the receiving area.

21. A holder as in claim 20 further comprising a printed circuit board located within the frame.

22. A holder as in claim 21 further comprising movement members connected between the frame and the contact elements for moving the contact elements, the movement members comprising shape memory alloy.

23. A holder as in claim 20 wherein the contact elements are connected to the frame by leaf springs.

24. A holder as in claim 23 further comprising sensors which are directly actuated by portions of the leaf springs.

25. A holder as in claim 20 wherein the contact elements are movably mounted to the frame by springs and the holder further comprises tensioning members to move the contact elements and deflect the springs.

26. A holder as in claim 25 wherein the tensioning members comprise shape memory alloy and the holder further comprises a heater for heating the tensioning members.

27. A device for gripping a substantially planar object comprising:
a frame for holding the substantially planar object at a predetermined position having a center location;
a rest depending from the frame and disposed for simultaneously supporting a bottom surface of an edge region of the object on opposite sides of the object; and
an element movably connected to the frame and moveable in a first direction from a first position to a second position relative to the rest for substantially simultaneously contacting a top surface of the edge region of the object on opposite sides of the object, wherein the rest and the element operate to effect top to bottom pinching of the edge region to secure the edge region of the object between the rest and the element, and wherein the rest is substantially fixed in the first direction relative to the center location defined by the frame.

28. The device of claim 27, wherein the edge region comprises a first chamfer including the first surface and a second chamfer including the second surface, and wherein the first and second chamfers are mutually opposite.

29. The device of claim 27, wherein the edge region is free of structured areas formed during a production process.

30. The device of claim 27, wherein the rest includes a curved surface such that there is substantially a point contact between the rest and the first surface.

31. The device of claim 27, wherein the rest is adjustable in a direction perpendicular to a first plane of the object.

32. The device of claim 27, wherein the element includes a curved surface such that there is substantially a point contact between the element and the second surface.

33. The device of claim 27, wherein the element has a generally spherical shape that presses the object against the rest.

34. The device of claim 27, wherein the element comprises a pressure contact portion having a diameter parallel to a second plane of the object.

35. The device of claim 27, further comprising a spring element for biasing the element toward the object and for causing the contact pressure element to apply pressure to the second surface.

36. The device of claim 35, wherein the spring element is a leaf spring.

37. The device of claim 27, further comprising a tension element for pulling the element away from the object and for causing the element and the rest to release the edge region.

38. The device of claim 37, wherein the tension element further comprises a shape memory alloy wire that contracts to pull the element away from the object.

39. The device of claim 37, further comprising a sensor for sensing whether the edge region of the object has been secured or released.

40. The device of claim 39, wherein the sensor senses a position of the spring element and generates a signal when the edge region is released.

41. A method for gripping the edge of a substantially planar object comprising:
providing a frame for holding the substantially planar object at a predetermined position having a center location; supporting a bottom surface of an edge region of the object with a rest depending from the frame, the rest being disposed to simultaneously support the bottom surface of the edge region on opposite sides of the planar object; and
contacting a top surface of the edge region with an element movably connected to the frame, the element being arranged to substantially simultaneously contact the top surface of the edge region on opposite sides of the planar object, wherein the supporting and contacting actions effect pinching the top to bottom surfaces of the edge region to secure the edge region of the object between the rest and the element and wherein contacting the top surface comprises moving the element in a first direction relative to the center location defined by the frame, wherein the rest is substantially fixed in the first direction relative to the center location defined by the frame.

42. The method of claim 41, wherein the edge region comprises a first chamfer including the first surface and a second chamfer including the second surface, and wherein the first and second chamfers are mutually opposite.

43. The method of claim 41, wherein supporting the first surface and contacting the second surface includes providing a point contact with the first and second surfaces, respectively.

44. The method of claim 41, further comprising:
utilizing a contact pressure element for contacting the second surface; and biasing the contact pressure element toward the object causing the contact pressure element to apply pressure to the second surface.

45. The method of claim 44, further comprising pulling the contact pressure element away from the object causing the contact pressure element to release the edge region.

46. The method of claim 45, further comprising sensing whether the edge region of the object has been secured or released and generating a signal upon release of the edge region.

47. A clamping device comprising a frame for holding a planar object at a predetermined position, the clamping device further comprising a plurality of gripping surfaces connected to the frame, at least a first of which is movable in a first direction to pinch an edge region thickness of a planar object between at least the first gripping surface and a second of the plurality of gripping surfaces to secure the edge region of the object, wherein the second of the plurality of gripping surfaces is fixed in the first direction relative to the center location defined by the frame; and
wherein the second gripping surface is disposed to simultaneously support a bottom surface of an edge region on opposite sides of the object, and wherein the first gripping surface is arranged to substantially simultaneously contact a top surface of the edge region on opposite sides of the object, wherein the top surface of the edge region opposes the bottom surface of the edge region.

48. The clamping device of claim 47, wherein at least the first and second gripping surfaces are curved to provide a substantially point contact with the edge region of the object.

49. The clamping device of claim 47, further comprising a spring element for biasing the first gripping surface in a direction toward and parallel to the object causing the first gripping surface to apply pressure to the edge region.

50. The clamping device of claim 47, further comprising a tension element for pulling the first gripping surface in a direction away from and parallel to the object causing the first gripping surface to release the edge region.

51. The clamping device of claim 50, further comprising a sensor for sensing whether the edge region of the object has been secured or released and for generating a signal when the edge region is released.

52. A device for positioning a substantially planar object comprising:
a holder for carrying the object, the holder being adapted to hold the object at a predetermined position relative to the holder; and
a clamping device connected to the holder, the clamping device including:
a rest for simultaneously supporting a bottom surface of an edge region of the object on opposite sides of the object; and
an element movably connected to the holder and moveable in a first direction from a first position to a second position for substantially simultaneously contacting a top surface of the edge region of the object on opposite sides of the object, wherein the top surface of the edge region is opposed to the bottom surface of the edge region, and wherein the rest and the element operate to effect top to bottom pinching of the edge region to secure the edge region of the object between the rest and the element;
wherein the rest is substantially fixed in the first direction relative to the predetermined position.

53. The device of claim 52, wherein the edge region comprises a first chamfer including the first surface and a second chamfer including the second surface, and wherein the first and second chamfers are mutually opposite.

54. The device of claim 52, wherein the edge region is free of structured areas formed during a production process.

55. The device of claim 52, wherein the rest includes a curved surface such that there is substantially a point contact between the rest and the first surface.

56. The device of claim 52, wherein the rest is adjustable in a direction perpendicular to a first plane of the object.

57. The device of claim 52, wherein the element includes a curved surface such that there is substantially a point contact between the element and the second surface.

58. The device of claim 52, wherein the element has a generally spherical shape that presses the object against the rest.

59. The device of claim 52, wherein the element comprises a pressure contact portion having a diameter parallel to a plane of the object.

60. The device of claim 52, further comprising a spring element for biasing the element toward the object and for causing the contact pressure element to apply pressure to the second surface.

61. The device of claim 60, wherein the spring element is a leaf spring.

62. The device of claim 52, further comprising a tension element for pulling the element away from the object and for causing the element and the rest to release the edge region.

63. The device of claim 62, wherein the tension element further comprises a shape memory alloy wire that contracts to pull the element away from the object.

64. The device of claim 62, further comprising a sensor for sensing whether the edge region of the object has been secured or released.

65. The device of claim 64, wherein the sensor senses a position of the spring element and generates a signal when the edge region is released.

* * * * *